United States Patent
Loh et al.

[11] Patent Number: 5,998,253
[45] Date of Patent: Dec. 7, 1999

[54] METHOD OF FORMING A DOPANT OUTDIFFUSION CONTROL STRUCTURE INCLUDING SELECTIVELY GROWN SILICON NITRIDE IN A TRENCH CAPACITOR OF A DRAM CELL

[75] Inventors: Stephen K. Loh, Fishkill, N.Y.; Christine Dehm, Munich, Germany; Christopher C. Parks, Beacon, N.Y.

[73] Assignees: Siemens Aktiengesellschaft, Munich, Germany; International Business Machines Corporation, Armonk, N.Y.

[21] Appl. No.: 08/993,743

[22] Filed: Dec. 19, 1997

Related U.S. Application Data

[63] Continuation-in-part of application No. 08/939,209, Sep. 29, 1997.

[51] Int. Cl.⁶ .................................................. H01L 21/70
[52] U.S. Cl. ........................ 438/243; 438/786; 438/791
[58] Field of Search .................................. 438/238, 244, 438/245, 248, 791, 780, 243, 239, 249, 922

[56] References Cited

U.S. PATENT DOCUMENTS

| | | | |
|---|---|---|---|
| 4,952,524 | 8/1990 | Lee et al. | 438/437 |
| 5,302,541 | 4/1994 | Akazawa | 438/152 |
| 5,334,548 | 8/1994 | Shen et al. | 438/246 |
| 5,376,575 | 12/1994 | Kim et al. | 438/239 |
| 5,597,760 | 1/1997 | Hirota | 438/397 |
| 5,843,812 | 12/1998 | Hwang | 438/197 |

*Primary Examiner*—Wael Fahmy
*Assistant Examiner*—Kurt Eaton
*Attorney, Agent, or Firm*—Stanton C. Braden

[57] ABSTRACT

A method for controlling dopant outdiffusion within an integrated circuit is disclosed. The method includes providing a substrate, forming a trench in the substrate, and forming a first doped layer in the trench. The first doped layer has a first dopant concentration. The method further includes forming a dopant diffusion control structure above the first doped layer. The dopant diffusion control structure includes silicon nitride ($Si_xN_y$) disposed in grain boundaries of the first doped layer. The method also includes forming a second layer above the dopant diffusion control structure. The second layer has a second dopant concentration lower than the first dopant concentration. Forming the dopant diffusion control structure includes, in one example, forming a first oxide layer over the first doped silicon layer, nitridizing the first oxide layer, thereby forming an oxynitride ($SiO_xN_y$) layer and causing the silicon nitride to migrate into the grain boundaries, and removing the oxynitride layer, thereby exposing the silicon nitride at the grain boundaries at an interface of the first doped layer.

14 Claims, 3 Drawing Sheets

METHOD OF FORMING A DOPANT OUTDIFFUSION CONTROL STRUCTURE INCLUDING SELECTIVELY GROWN SILICON NITRIDE IN A TRENCH CAPACITOR OF A DRAM CELL

This patent application is a continuation-in-part of a patent application U.S. Ser. No. 08/939,209 entitled "Method and Apparatus for Minimizing Dopant Outdiffusion in Gate Structures" by Stephen K. Loh, Christine Dehm, and Christopher C. Parks, filed on Sep. 29, 1997 and incorporated herein by reference.

BACKGROUND OF THE INVENTION

The invention relates generally to methods and apparatus for fabricating dynamic random access memory circuits (DRAMs). More particularly, the invention relates to methods and apparatus for controlling the amount of dopant outdiffusion from a DRAM trench capacitor into drains or gates of adjacent transistors in a DRAM.

In the fabrication of a DRAM, many high temperature, e.g., anneal, steps may be employed. By way of example, such high temperature steps may be employed to heal dislocations, reflow dielectrics, and/or to activate doped junctions. The high temperature steps may, however, cause an undue amount of dopants to diffuse from the underlying doped polysilicon layer of the trench capacitor into an adjacent drain or source of the transistor coupled to that capacitor. This undue diffusion may occur through a buried strap structure, i.e., the structure employed to connect the underlying doped polysilicon with the drain/source region of the transistor.

To facilitate discussion, FIG. 1 is a diagrammatic (and not to scale) representation of a portion of a DRAM circuit, including trench capacitor 100 and transistor 102. A buried strap structure 104 is provided to electrically couple underlying doped polysilicon region 106 with a doped junction region 108 of transistor 102 in the final DRAM cell structure. Doped junction region 108 may represent, for example, either a drain or a source of transistor 102.

Roughly speaking, trench capacitor 100 is formed by first forming a trench within silicon substrate 110 and then conformally deposit a dielectric layer 112 into the trench. Dielectric layer 112, which may be an oxide ($SiO_2$), nitride ($Si_xN_y$), oxynitride ($SiN_xO_y$), or a combination of films, electrically insulates a subsequently deposited doped polysilicon layer 114 (e.g., phosphorous-doped polysilicon layer) from the substrate.

Thereafter, the trench is etched again to recess the polysilicon layer in the trench. An insulating material (e.g., silicon dioxide) is then deposited and etched to form an insulating spacer 116. Thereafter, another doped polysilicon layer (which may be similarly doped as polysilicon layer 104) is deposited within spacer 116 inside the trench. This doped polysilicon layer is then etched back to form the aforementioned doped polysilicon region 106. Buried strap structure 104, which may be intrinsic (i.e., undoped) or lightly doped polysilicon, is then formed above doped polysilicon region 106. The buried strap 104 may be formed by the deposition, planarization, and recess etch of a deposited polysilicon material.

During the subsequent high temperature steps, some of the dopants from underlying polysilicon region 106 are driven into buried strap 104, thereby lowering the resistance of buried strap 104. As can be seen in FIG. 1, the outdiffusion of dopants into buried strap 104 forms an electrical path between doped junction region 108 of transistor 102 and doped polysilicon region 114 of trench capacitor 100 through buried strap 104 and doped polysilicon region 106.

It has been found, however, that the aforementioned high temperature steps may cause an undue amount of dopants from underlying polysilicon region 106 to diffuse into doped junction region 108 through buried strap 104. This excessive dopant contamination of the doped junction regions generally detrimentally affects the performance of the associated transistor 102 (which includes the doped junction regions). Hence, high temperature steps are often limited in the prior art to reduce the amount of dopant outdiffusion into doped junction region 108. That is, the thermal budget of integrated circuit fabrication processes may be limited in order to reduce contamination.

Reducing the thermal budget of an integrated circuit fabrication process, while generally effective in reducing contamination of doped junction regions, often proves to be undesirable. For example, when the thermal budget is reduced, some high temperature steps, i.e., steps which occur at temperatures greater than about 900 degrees Centigrade, may be shortened. As mentioned, such steps are typically necessary to heal dislocations, reflow dielectrics, and to activate doped junctions, for example. Shortening these steps therefore compromises the structural integrity of the final IC. Further, for DRAMS, reducing the number of dislocations which may be healed generally significantly increases the retention time associated with the DRAM by decreasing device leakage. As the term is used herein, retention time refers to the time a DRAM cell retains its stored charge, and is typically limited by the rate at which the stored charge leaks away.

Therefore, what is desired is a method and a structure for controlling dopant outdiffusion from a highly doped region into the drain or source of a transistor structure in a DRAM that employs a buried strap structure during subsequent high temperature steps without compromising the integrity or the performance of the resultant DRAM.

SUMMARY OF THE INVENTION

The invention relates, in one embodiment to a method for controlling dopant outdiffusion within an integrated circuit. The method includes providing a substrate, forming a trench in the substrate, and forming a first doped silicon layer in the trench. The first doped silicon layer has a first dopant concentration. The method further includes forming a dopant diffusion control structure above the first doped silicon layer. The dopant diffusion control structure includes silicon nitride ($Si_xN_y$) disposed in grain boundaries of the first doped silicon layer. The method also includes forming a second silicon layer above the dopant diffusion control structure. The second silicon layer has a second dopant concentration lower than the first dopant concentration.

In one embodiment, forming the dopant diffusion control structure includes forming a first oxide layer over the first doped layer such as silicon, nitridizing the first oxide layer, thereby forming an oxynitride ($SiO_xN_y$) layer and causing the silicon nitride to form at the grain boundaries, and removing the oxynitride layer, thereby exposing the silicon nitride at the grain boundaries of the first doped silicon layer.

In another embodiment, the invention relates to a dynamic random access memory (DRAM) integrated circuit, which includes a substrate having a trench therein, and a first doped layer such as silicon disposed in the trench. The DRAM IC also includes a dopant diffusion control structure disposed above the first doped silicon layer. The dopant diffusion control structure includes silicon nitride ($Si_xN_y$) disposed in grain boundaries of the first doped silicon layer. The DRAM IC also includes a second layer such as silicon disposed above the dopant diffusion control structure. The second silicon layer has a second dopant concentration lower than the first dopant concentration.

In yet another embodiment, the invention relates to a method for controlling dopant outdiffusion between a first doped silicon layer in a trench capacitor and its associated transistor through a buried strap in a dynamic random access memory circuit. The first doped silicon layer has a first dopant concentration. The buried strap has a second dopant concentration lower than the first dopant concentration. The method includes providing a dopant diffusion control structure above the first doped silicon layer. The dopant diffusion control structure includes silicon nitride ($Si_xN_y$) disposed in grain boundaries of the first doped silicon layer. The dopant diffusion control structure is configured to permit at least some individual grains of the first doped silicon layer to form direct electrical contact with the buried strap at an interface of the first doped silicon layer and the buried strap.

These and other features and advantages of the present invention will be presented in more detail in the following detailed description of the invention and in the associated figures.

BRIEF DESCRIPTION OF THE DRAWINGS

The invention, together with further advantages thereof, may best be understood by reference to the following description taken in conjunction with the accompanying drawings in which like reference numbers refer to similar structures and in which.

DETAILED DESCRIPTION OF THE EMBODIMENTS

The present invention will now be described in detail with reference to a few embodiments thereof as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known structures and steps have not been described in detail in order not to unnecessarily obscure the present invention.

In order to reduce the amount of dopant outdiffusion from a highly doped layer (e.g., the underlying highly doped layer of the trench capacitor) into a lightly doped (or undoped) layer (e.g., a buried strap) during subsequent high temperature steps, a dopant diffusion control structure is provided. The dopant diffusion control structure functions to slow or impede the diffusion of dopants along silicon grain boundaries even after repeated high temperature steps while permitting the two layers adjacent to the dopant diffusion control structure to remain in intimate electrical contact, thereby minimizing contact resistance therebetween.

Figure 2:
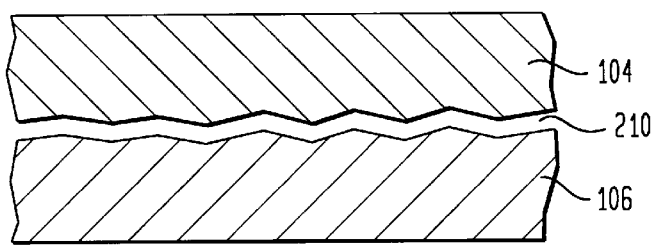
FIG. 2 shows, in accordance with one embodiment of the invention, a simplified diagrammatic representation of the relevant layers of an improved DRAM cell, including the inventive dopant diffusion control structure.

The features and advantages of the present invention may be better understood with reference to the figures and discussions that follow. FIG. 2 is a diagrammatic (and not to scale) representation of the relevant layers of a DRAM memory cell, including underlying doped polysilicon region 106, dopant diffusion control structure 210, and buried strap 104. It should be appreciated that for illustrative purposes, some features of the DRAM cell have been exaggerated, while others have not been shown. As will be discussed in greater detail herein, dopant diffusion control structure 210 is, in reality, not a continuous film. Rather, dopant diffusion control structure 210 comprises a collection of nitride nodules disposed at polysilicon grain boundaries (and along the grain boundaries into the polysilicon layer in some cases) to control the diffusion of dopants along the polysilicon grain boundaries into the buried strap (and concomitantly into the doped junction region of the associated transistor). As the term is used herein, controlled dopant outdiffusion refers to the reduction of outdiffusion associated with excess thermal cycles, but not elimination of outdiffusion necessary for electrical conduction or the fact that outdiffusion may be controlled to a specific range of value. Preferably, dopant diffusion control structure 210 does not substantially interfere with the intimate electrical contact between polysilicon grains of the underlying polysilicon layer (e.g., of polysilicon region 106 of FIG. 2) and the buried strap (e.g., buried strap 104).

Figure 3:
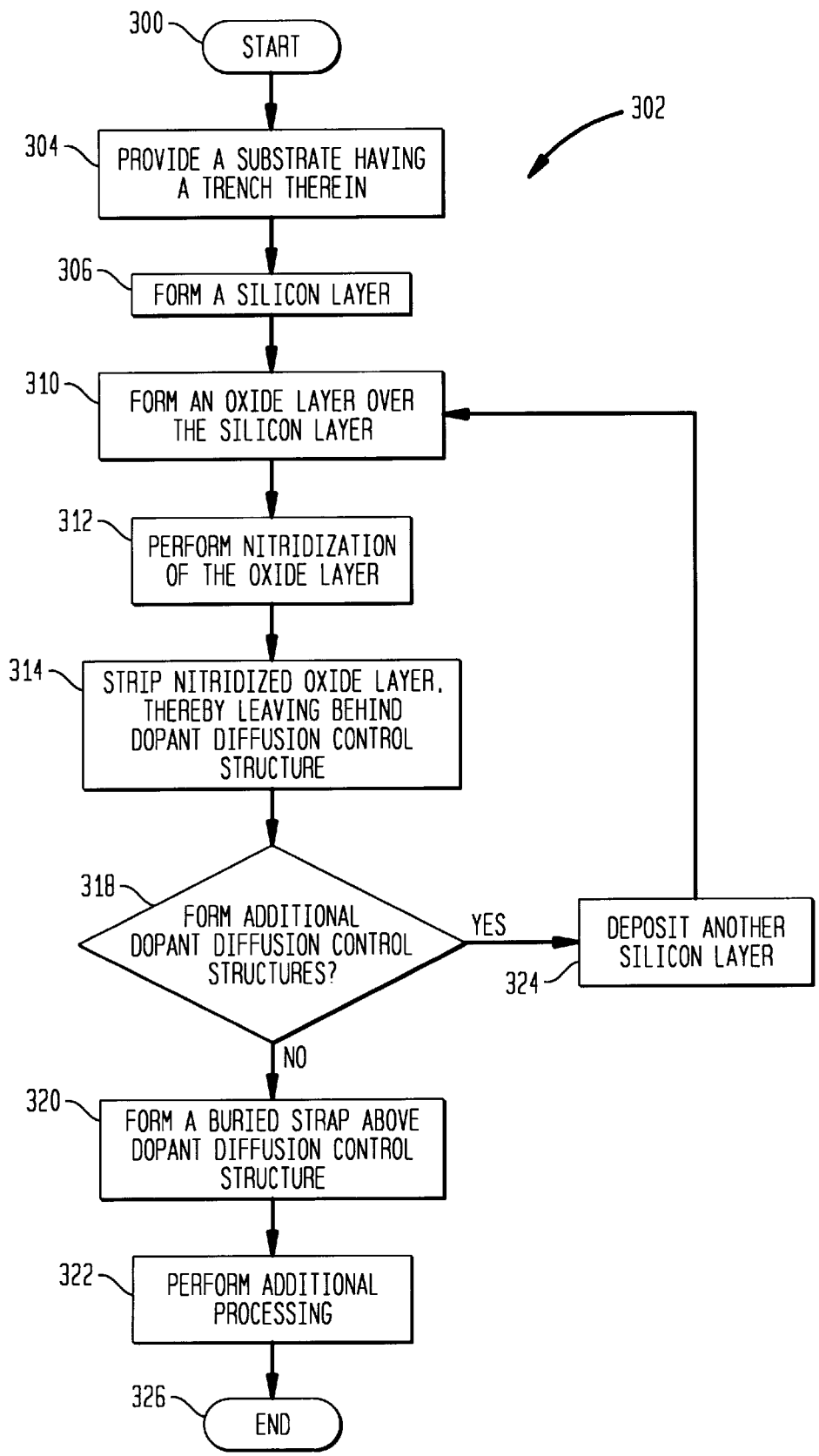
FIG. 3 is a process flow diagram which illustrates the steps associated with one method of fabricating the dopant diffusion control structure in a DRAM cell.

FIG. 3 is a process flow diagram which illustrates, in accordance with one embodiment of the present invention, the steps which may be employed to fabricate a DRAM memory cell, including a dopant diffusion control structure. Although the steps of FIG. 3 are specific to a DRAM memory cell having a buried strap, it should be borne in mind that the invention applies to the controlled dopant outdiffusion between any two differently doped layers. The process 302 begins at step 304 where a substrate having therein a trench is provided. The substrate may generally be formed from silicon, and may further include various layers associated with the overall formation of an integrated circuit. Such layers may include, but are not limited to, conductive (e.g., metallization) layers and insulator (e.g., oxide) layers. The trench itself may represent a deep trench (e.g., one having an aspect ratio of 15:1 or even higher) suitable for forming a trench capacitor.

Figure 1:
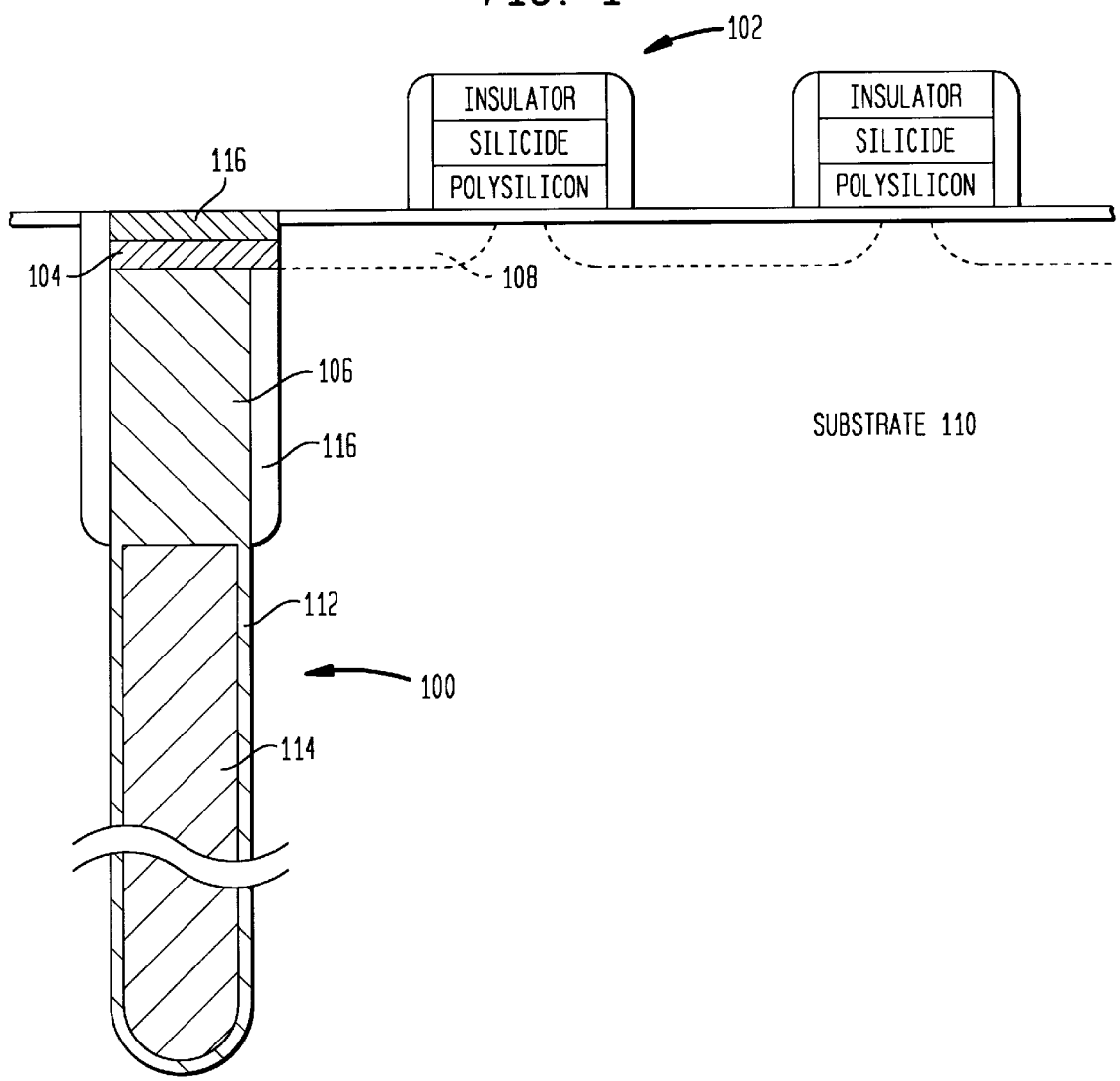
FIG. 1 is a diagrammatic representation of a portion of a conventional DRAM IC, including the trench capacitor and its associated transistor.

After the substrate having therein a trench is provided, various components of the trench capacitors, up to the polysilicon region underlying the buried strap (e.g., up to polysilicon region 106 of FIG. 1) may be formed in steps 306. This underlying doped polysilicon layer, may be doped using any suitable method, such as in situ doping or implantation of a dopant followed by an annealing process, as will be appreciated by those skilled in the art. While dopants used to dope the underlying polysilicon layer may be widely varied, in one embodiment, suitable dopants include phosphorous, boron, and arsenic.

A sacrificial oxide layer is then formed in step 310 within the trench. The sacrificial oxide layer, which may be a silicon dioxide ($SiO_2$) layer, may be grown using any suitable method. Typically, the sacrificial oxide layer may be grown using a rapid thermal oxidation (RTO) in oxygen at a temperature in the range of approximately 900 degrees Centigrade to approximately 1100 degrees Centigrade, as for example approximately 925 degrees Centigrade, for a time duration in the range of approximately 30 seconds to approximately 120 seconds, as for example approximately 60 seconds.

Once the sacrificial oxide layer is grown in step 310, the process flow proceeds to step 312 in which a nitridization process is performed on the sacrificial oxide layer. In other words, the oxide is nitridized. Oxide may generally be nitridized using any suitable method, such as a rapid thermal nitridization (RTN) using ammonia ($NH_3$) at a temperature in the range of approximately 900 degrees Centigrade to approximately 1100 degrees Centigrade, e.g., approximately 1050 degrees Centigrade, for a duration in the range of approximately 20 seconds to 120 seconds, e.g., approximately 30 seconds.

When the oxide layer is nitridized to form an oxynitride ($SiO_xN_y$) layer, nitride, e.g., silicon nitride ($Si_3N_4$ or generally $Si_xN_y$), may form on the surface of the silicon layer and particularly at the grain boundaries of the silicon layer. That is, some of the nitride species diffuse through the oxynitride layer and lodge in between the grain boundaries of the polysilicon grains of the underlying polysilicon layer.

The amount of nitride diffusion depends, in apart, on the thickness of the sacrificial oxide layer deposited. If the sacrificial oxide layer is too thick, not enough nitride may diffuse through the formed oxynitride layer to form nodules at the grain boundaries of the underlying polysilicon grain. If the sacrificial oxide layer is too thin, too much nitride may diffuse through the formed oxynitride layer to form a continuous film or sheet of nitride material, which disadvantageously interferes with the direct, intimate contact between the underlying polysilicon grains and the buried strap (i.e., increases the contact resistance therebetween). While the thickness of the sacrificial oxide layer may be widely varied to suit a particular application, in one embodiment, the thickness of the sacrificial oxide layer is in the range of approximately 40 Angstroms to approximately 150 Angstroms, preferably about 50 Angstroms.

After the nitridization on the sacrificial oxide layer is completed, the oxynitride layer is stripped, or otherwise etched, to expose nitride at the grain boundaries of the underlying polysilicon layer in step 314. The exposed nitride at the grain boundaries forms a dopant diffusion control structure which substantially slows dopant diffusion along the grain boundaries between the underlying polysilicon silicon layer and the buried strap, particularly during subsequent high temperature steps. It should be appreciated that the dopant diffusion control structure permits some degree of dopant diffusion to occur to reduce the resistance of the buried strap and improve contact resistance. By varying the initial dopant concentration of the buried strap itself, it is possible to achieve a low resistance buried strap while ensuring that an undue amount of dopants do not diffuse from the underlying polysilicon layer to detrimentally contaminate the doped junction region of the adjacent transistor.

A determination is made in step 318 regarding whether additional dopant diffusion control structures may be formed above the newly formed dopant diffusion control structures. Multiple dopant diffusion control structures are optional. In some cases, the multiple dopant diffusion control structures may form a matrix to better control the overall amount of dopant which may be diffused out of the underlying polysilicon layer.

If the determination is that additional dopant diffusion control structures are to be formed, another silicon layer (e.g., polysilicon or amorphous silicon) may be formed in step 324, to be followed by the formation of a sacrificial oxide layer (step 310), the nitridization thereof (step 312), and the removal of the oxynitride layer (step 314). In this mariner, as many dopant diffusion control structures may be formed as desired.

Alternatively, if the determination is that no additional dopant diffusion control structures are needed, the process flow moves to step 320 in which a buried strap is then formed above the dopant diffusion control structure(s). Then, in step 322, additional processing is performed to complete the processing of the DRAM cell. In general, the additional processing may include, but is not limited to, steps conventionally performed to complete the DRAM cell such as the formation of additional structures and performing high temperature steps to lower the resistance of the buried strap.

Referring next to FIGS. 4A–4D, the fabrication of a dopant diffusion control structure, using the steps described above with respect to FIG. 3, will be described in accordance with an embodiment of the present invention. It should be appreciated that for ease of illustration, the thicknesses of the underlying polysilicon region, the dopant diffusion control structure, and overlying buried strap structure have not been drawn to scale.

Figure 4A:
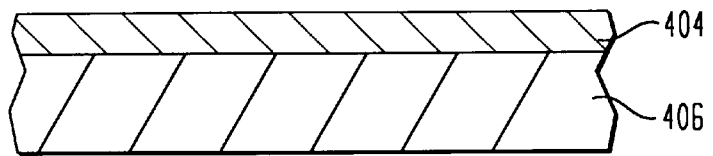
FIG. 4A–D illustrate, in accordance with one aspect of the present invention, the layers that may be formed in the fabrication of an improved DRAM cell, including the inventive dopant diffusion control structure.

The fabrication of portion 402 of a DRAM cell begin with the deposition of a sacrificial oxide layer 404 over the doped polysilicon layer 406 to promote the formation of a dopant diffusion control structure (FIG. 4A). As mentioned, the oxide layer may be formed, in one embodiment, by a rapid thermal oxidation (RTO) process with $O_2$ gas in a thermal chamber at about 925° C. for 60 seconds.

Figure 4B:
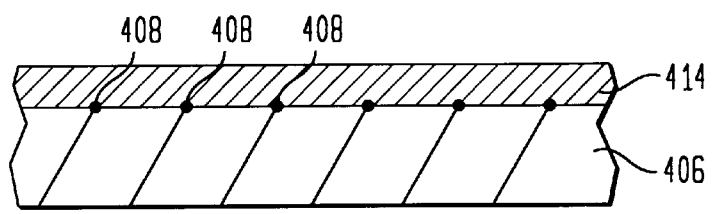

In FIG. 4B, oxide layer 404 is nitridized. In one embodiment, the nitridization is performed using a Rapid Thermal Nitridization (RTN) process employing $NH_3$ at about 1050° C. for 30 seconds. Alternatively, nitridization may be performed using $N_2O$, for example at about 1050° C. for 30 seconds or at other suitable process recipes. During the nitridization of the oxide layer 404, as described above with respect to FIG. 3, nitride is essentially formed at the grain boundaries 408 of doped polysilicon layer 406 to form a collection of nitride nodules along the grain boundaries of polysilicon grains at the interface of doped polysilicon layer 406 and the oxynitride layer 414 (i.e., the nitridized silicon oxide layer). For ease of illustration, the grain boundaries of doped polysilicon layer 406 are depicted by a plurality of parallel lines although, as is well known, these boundaries are in reality random. In some cases, the nitride may migrate preferentially along the polysilicon grain boundaries into the polysilicon layer.

Figure 4C:
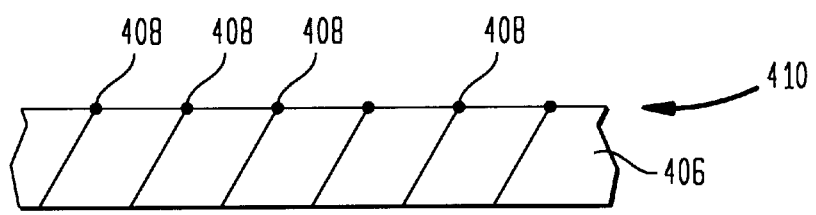

In FIG. 4C, the oxynitride layer that is formed by the nitridization process is stripped or etched away. In one embodiment, the oxynitride layer is etched using a wet etch process in a buffered hydrofluoric acid solution (about 40:1) for about 70 seconds. After the oxynitride layer is striped away, a dopant diffusion control structure 410, which may be a collection of nitride nodules lodged in between the grain boundaries of the underlying polysilicon grains, is left behind. The removal of the oxynitride layer also ensures that any layer subsequently deposited would have a direct, intimate electrical contract with underlying polysilicon layer 406. As mentioned earlier, multiple dopant diffusion control structures may be formed if desired by repeating the sequence of silicon deposition (which may be doped or undoped subsequently), sacrificial oxide formation, sacrificial oxide nitridization, and sacrificial oxynitride strip.

Figure 4D:
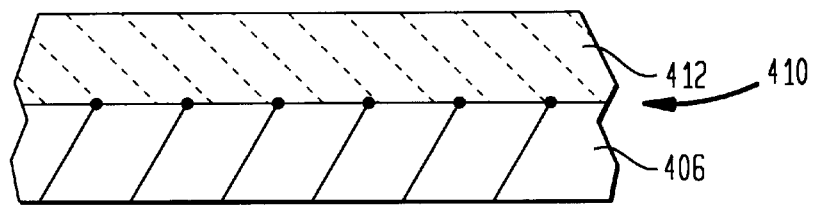

In FIG. 4D, a buried strap structure 412 is formed over the dopant diffusion control structure. As shown in FIG. 4D, the presence of the nitride nodules at the polysilicon grain boundaries helps to slow down the diffusion of dopants from underlying polysilicon layer 406 into buried strap structure 412, particularly with regard to dopant diffusion along the grain boundaries and particularly during subsequent high temperature steps.

As can be appreciated from the foregoing, the invention employs the oxide layer as a sacrificial layer for forming a dopant diffusion control structure. In a nonobvious manner, the formed dopant diffusion control structure permits the underlying doped polysilicon layer and the buried strap to remain in intimate electrical contact while minimizing the amount of dopant diffusion therebetween even during subsequent high temperature steps. Since the amount of dopant diffusion is controlled without adverse impact to the contact resistance between the layers, the invention advantageously allows a higher thermal budget during IC fabrication, as well as a broader process window. In this manner, it is possible to continue or to increase the application of the high temperature steps to facilitate, for example, heal dislocations, improvement of DRAM cell retention time, and the like. It is expected that the invention has its most advantageous applications in the fabrication of highly dense integrated circuits, e.g., those having feature sizes of 0.25 micron or even lower, since the increased thermal budget feature is particularly useful in the fabrication of these devices.

EXAMPLES

It has been demonstrated that with the inventive dopant diffusion control structure, outdiffusion of dopants have been slowed. By way of example, the percentage of phosphorous dopants diffused from a highly doped polysilicon layer (e.g., $5.8 \times 10^{20}/cm^{-3}$ atomic concentration of phosphorous) to an intrinsic polysilicon layer has been reduced, in one case, from about 33% to about 3% (i.e., a factor of roughly 11) even after 10 minutes of anneal at 900° C. As another example, the percentage of boron dopants diffused from the highly doped polysilicon layer (e.g., $2.8 \times 10^{20}/cm^{-3}$ atomic concentration of boron) to an intrinsic polysilicon layer has been reduced, in one case, from greater than about 33% (e.g., 50%) to about 12% after the same 10 minutes of anneal at 900° C. As yet another example, the percentage of arsenic dopants diffused from the highly doped polysilicon layer (e.g., e.g., $5 \times 10^{20}/cm^{-3}$ atomic concentration of arsenic) to an intrinsic polysilicon layer has been reduced, in one case, from about 32% to about 4.8% after 10 minutes of anneal at 1,000° C.

Similar improvements have been observed even when the anneal temperature is increased. For example, at about 1000° C. anneal for about 10 minutes, only about 10% of the phosphorous dopant diffuses out of the highly doped layer in the test structure (versus about 32% without the diffusion control in place). As another example, at about 1050° C. anneal for about 10 minutes, only about 15% of the phosphorous dopant diffuses out of the highly doped layer in the test structure (versus about 40% without the diffusion control in place). As yet another example, at about 1050° C. anneal for about 10 minutes, only about 4.7% of the arsenic dopant diffuses out of the highly doped layer in the test structure (versus about 32% without the diffusion control in place). Due to the stability of the nitride ($Si_3N_4$ or generally $Si_xN_y$) material, similar performance is expected even if the temperature is increased further.

Although only a few embodiments of the present invention have been described, it should be understood that the present invention may be embodied in many other specific forms without departing from the spirit or the scope of the invention. By way of example, while the dopant diffusion control structure has been discussed in connection with a buried strap application in a DRAM cell, it may be suitable for use in a variety of other applications in which the controlled outdiffusion of dopants between a doped silicon layer (i.e., polysilicon or amorphous silicon layer) and a lightly doped or undoped silicon (i.e., polysilicon or amorphous silicon layer) is desired. The creation of a dopant diffusion control structure has been described by using a sacrificial oxide layer which is nitridized then etched. However, it should be appreciated that any suitable method may generally be used to create a dopant diffusion control structure without departing from the spirit or the scope of the present invention. By way of example, the nitrogen may be implanted using a low energy implantation process to create a dopant diffusion control structure (with or without the use of a sacrificial oxide layer). While not wishing to be bound by theory, it is believed that during anneal, the nitrogen may migrate to grain boundary sites. Alternatively, the oxynitride layer may be deposited directly using a low pressure chemical vapor deposition (LPCVD) or plasma-enhanced chemical vapor deposition (PECVD). Again not wishing to be bound by theory, it is believed that during plasma processing the nitrogen species may driven in and form along grain boundaries. Therefore, the present examples are to be considered as illustrative and not restrictive, and the invention is not to be limited to the details given herein, but may be modified within the scope of the appended claims along with their full scope of equivalents.

What is claimed is:

1. A method for controlling dopant outdiffusion within an integrated circuit, said method comprising:

providing a substrate;

forming a trench in said substrate;

forming a first doped layer in said trench, said first doped layer having a first dopant concentration;

forming a dopant diffusion control structure above said first doped layer, said dopant diffusion control structure comprising silicon nitride ($Si_xN_y$) disposed in grain boundaries of said first doped silicon layer, wherein forming said dopant diffusion control structure includes:

(a) forming a first oxide layer over said first doped layer;

(b) nitridizing said first oxide layer, thereby forming an oxynitride ($SiO_xN_y$) layer and causing said silicon nitride to migrate into said grain boundaries; and (c) removing said oxynitride layer, thereby exposing said silicon nitride at said grain boundaries at an interface of said first doped layer; and forming a second silicon layer above said dopant diffusion control structure, said second silicon layer having a second dopant concentration lower than said first dopant concentration.

2. The method of claim 1 wherein the first doped layer and second silicon layers comprise silicon.

3. The method of claim 2 wherein said first oxide layer has a thickness selected to prevent a formation of a continuous film of silicon nitride at said interface.

4. The method of claim 2 wherein forming said first oxide layer includes thermally growing said first oxide layer at a first process temperature in a range of about 900° C. about 1000° C.

5. The method of claim 2 wherein nitridizing said first oxide layer includes nitridizing said first oxide layer at a second process temperature in a range of about 900° C. to about 1100° C.

6. The method of claim 1 wherein said first doped layer comprises a doped polysilicon layer.

7. The method of claim 2 wherein said integrated circuit represents a dynamic random access memory circuit (DRAM) and wherein said second silicon layer represents a buried strap structure.

8. The method of claim 7 further comprising:

performing at least a high temperature step after said second silicon layer is formed.

9. The method of claim 2 wherein said first doped layer is doped with a dopant selected from the group consisting of arsenic, phosphorous, and boron.

10. The method of claim 9 wherein said second silicon layer is undoped.

11. A method for controlling dopant outdiffusion between a first doped layer in a trench capacitor and its associated transistor through a buried strap in a DRAM circuit, said first doped layer having a first dopant concentration, said buried strap having a second dopant concentration lower than said first dopant concentration, said method comprising providing a dopant diffusion control structure above said first doped layer, said dopant diffusion control structure comprising silicon nitride ($Si_xN_y$) disposed in grain boundaries of said first doped layer, said dopant diffusion control structure being configured to permit at least some individual grains of said first doped layer to form direct electrical contact with said buried strap at an interface of said first doped layer and said buried strap, wherein said providing said dopant diffusion control structure includes:

(a) forming a first oxide layer over said first doped layer;

(b) nitridizing said first oxide layer, thereby forming an oxynitride ($SiO_xN_y$) layer and causing said silicon nitride to migrate into said gain boundaries; and (c) removing said oxynitride layer, thereby exposing said silicon nitride at said grain boundaries at an interface of said first doped layer.

12. The method of claim 11 wherein the first doped layer and buried strap layers comprise silicon.

13. The method of claim 12 further comprising performing at least one high temperature step after said buried strap is formed, said high temperature step represents a process step employing a process temperature above about 900° C.

14. The method of claim 12 wherein said first oxide layer has a thickness selected to prevent a formation of a continuous film of silicon nitride at said interface.

* * * * *